United States Patent
Yokoyama et al.

(10) Patent No.: US 8,395,194 B2
(45) Date of Patent: Mar. 12, 2013

(54) SOLID-STATE IMAGING DEVICE

(75) Inventors: Haruhisa Yokoyama, Kyoto (JP); Hiroshi Sakoh, Niigata (JP); Kazuhiro Yamashita, Osaka (JP); Mitsuo Yasuhira, Osaka (JP); Yuichi Hirofuji, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/238,537

(22) Filed: Sep. 21, 2011

(65) Prior Publication Data
US 2012/0037960 A1   Feb. 16, 2012

Related U.S. Application Data

(63) Continuation of application No. PCT/JP2010/000352, filed on Jan. 22, 2010.

(30) Foreign Application Priority Data

Mar. 26, 2009  (JP) .................................. 2009-077646

(51) Int. Cl.
H01L 27/148 (2006.01)
H01L 27/146 (2006.01)
H01L 21/00 (2006.01)

(52) U.S. Cl. . 257/230; 257/223; 257/445; 257/E27.139; 257/E27.145; 257/E27.162; 438/60; 438/75

(58) Field of Classification Search .................. 257/223, 257/230, 445, E27.139, E27.145, E27.162; 438/60, 75
See application file for complete search history.

(56) References Cited

U.S. PATENT DOCUMENTS

| 4,547,957 | A  | * | 10/1985 | Savoye et al. .................. 438/73 |
| 6,507,054 | B2 |   | 1/2003  | Mizobuchi et al. |
| 7,973,378 | B2 |   | 7/2011  | Sakoh et al. |
| 8,043,883 | B2 |   | 10/2011 | Sakoh et al. |
| 2002/0140003 | A1 |   | 10/2002 | Mizobuchi et al. |
| 2008/0108167 | A1 | * | 5/2008 | Abe et al. ........................ 438/59 |
| 2008/0217724 | A1 | * | 9/2008 | Uya ............................. 257/460 |

(Continued)

FOREIGN PATENT DOCUMENTS

JP  62-232958   10/1987
JP  04-154284   5/1992

(Continued)

OTHER PUBLICATIONS

T. Joy et al., "Development of a Production-REady, Back-Illuminated CMOS Image Sensor with Small Pixels", IEDM, 2007, pp. 1007-1010.

Primary Examiner — Kimberly Rizkallah
Assistant Examiner — Alexander Belousov
(74) Attorney, Agent, or Firm — McDermott Will & Emery LLP

(57) ABSTRACT

A solid-state imaging device according to the present invention is of a MOS type and includes a plurality of pixels arranged in rows and columns, and includes: a semiconductor substrate; a photodiode which is formed in the semiconductor substrate and converts, into a signal charge, light that is incident from a first main surface of the semiconductor substrate; a transfer transistor which is formed in a second main surface of the semiconductor substrate and transfers the signal charge converted by the photodiode; a light shielding film which is conductive and formed on a boundary between the pixels, above the first main surface of the semiconductor substrate; an overflow drain region electrically connected to the light shielding film and formed in the first main surface of the semiconductor substrate; and an overflow barrier region formed between the overflow drain region and the photodiode.

14 Claims, 12 Drawing Sheets

U.S. PATENT DOCUMENTS

| | | | |
|---|---|---|---|
| 2008/0248607 A1* | 10/2008 | Nomura et al. | 438/75 |
| 2008/0290382 A1* | 11/2008 | Hirota | 257/291 |
| 2010/0327390 A1* | 12/2010 | McCarten et al. | 257/447 |
| 2011/0156104 A1* | 6/2011 | Yamaguchi | 257/222 |
| 2011/0284980 A1 | 11/2011 | Sakoh et al. | |
| 2012/0085888 A1* | 4/2012 | Endo et al. | 250/208.1 |
| 2012/0092536 A1* | 4/2012 | Hirota | 348/294 |

FOREIGN PATENT DOCUMENTS

| | | |
|---|---|---|
| JP | 07-078959 | 3/1995 |
| JP | 2001-127276 | 5/2001 |
| JP | 2001-257339 | 9/2001 |
| JP | 2001-284569 | 10/2001 |
| JP | 2005-268643 | 9/2005 |
| JP | 2006-049338 | 2/2008 |
| JP | 2008-294176 | 12/2008 |

* cited by examiner

SOLID-STATE IMAGING DEVICE

CROSS REFERENCE TO RELATED APPLICATION

This is a continuation application of PCT application No. PCT/JP2010/000352 filed on Jan. 22, 2010, designating the United States of America.

BACKGROUND OF THE INVENTION (1) Field of the Invention

The present invention relates to a solid-state imaging device, and particularly relates to a back-illuminated MOS solid-state imaging device.

(2) Description of the Related Art

In recent years, in a solid-state imaging device such as a CCD image sensor and a MOS image sensor, the need for further reduction in pixel area has been growing to meet the need for further increase in number of pixels. Along with this, in a surface-illuminated solid-state imaging device which includes electrodes and lines on a substrate surface in an imaging region and receives incident light from a surface side of the substrate, it becomes more difficult to achieve sufficient light collection properties for collecting the light onto a photoelectric conversion unit (photodiode). As a means to solve this problem, a back-illuminated solid-state imaging device has been suggested whose light collection properties are enhanced by causing photoelectric conversion inside the substrate through reception of incident light from a back side of a substrate in which no line or electrode is provided (for example, see: T. Joy, et al., "Development of a Production-Ready, Back-illuminated CMOS Image Sensor with Small Pixels", IEDM2007, pp. 1007-1010; and Japanese Unexamined Patent Application Publication NO. 2006-49338).

On the other hand, when the solid-state imaging device is irradiated with light of high intensity, a large amount of charge is generated in the photodiode, and the amount of the generated charge exceeds an amount of charge that the photodiode can accumulate. In this case, the charge leaks into an adjacent photodiode, causing output of a signal that has not originated from an imaging object. This phenomenon is generally called blooming. A generally-known means for suppressing the blooming is an overflow drain configuration. FIGS. 10A and 10B each show an example of the overflow drain configuration adopted for the back-illuminated MOS solid-state imaging device.

FIG. 10A is a cross-sectional view showing an example of a pixel configuration of a solid-state imaging device 10 which is a conventional back-illuminated MOS solid-state imaging device. The solid-state imaging device 10 includes an n-type photoelectric conversion unit (photodiode) 21 formed inside a p-type semiconductor substrate, and an element separation region (not shown). In addition, the solid-state imaging device 10 includes: a gate oxide film (not shown) of a MOS transistor, gate electrodes 31 and 32, a contact (not shown), and a wiring layer 40 which are formed on a second main surface 16 (top side) of the semiconductor substrate 30. In addition, the solid-state imaging device 10 includes a color filter 64 and an on-chip lens 65 which are formed above a first main surface 15 (back side) of the semiconductor substrate 30.

The overflow drain configuration of such a back-illuminated solid-state imaging device 10 will be described with reference to FIG. 10B. FIG. 10B is a cross-sectional view mainly showing, of the pixel cross-section shown in FIG. 10A, a configuration of a main part of an inside of the semiconductor substrate 30. As shown in FIG. 10B, the following elements are formed on the semiconductor substrate 30: an n-type floating diffusion region 33 for converting, into voltage, the charge read from the photodiode 21 of n-type; and an overflow barrier region 36 which functions, when the photodiode 21 accumulates an excess charge, as a path for discharging the excess charge to the floating diffusion region 33. Here, the solid-state imaging device 10 is so designed that the overflow barrier region 36 has a higher potential than a p-type region (semiconductor substrate 30) around the overflow barrier region 36.

The floating diffusion region 33 is connected to a transfer transistor 22 and a reset transistor which discharges the charge from the floating diffusion region 33. The solid-state imaging device 10 discharges the charge to a power supply by turning on (turning into an ON-state) the reset transistor after converting the charge into voltage (after a reading operation). Thus, in the conventional solid-state imaging device 10, by keeping the reset transistor in an ON-state except when reading the charge, the excess charge which is an excessively-accumulated amount of charge is discharged from the overflow barrier region 36 via the floating diffusion region 33. This prevents the excess charge from flowing into the photodiode and so on of another pixel.

SUMMARY OF THE INVENTION

However, in the configuration in which the floating diffusion region also functions as an overflow drain, it is necessary to turn off the reset transistor for the reading operation, and this suspends the overflow drain operation for discharging the excess charge that is generated in the photodiode from the incident light of high intensity. This does not allow the conventional solid-state imaging device to absorb excess charge when light of high intensity is incident at the time of reading the charge. This presents a problem of the conventional solid-state imaging device having a difficulty in suppressing the blooming resulting from a charge leakage into an adjacent pixel and so on.

On the other hand, in recent years, a solid-state imaging device having what is called a multipixel one-cell configuration has become known, in which a plurality of photodiodes share one floating diffusion region. In such a solid-state imaging device having the multipixel one-cell configuration, since one floating diffusion is shared between the plurality of photodiodes, it takes a longer period of time to keep the reset transistor in an OFF state for the reading. For this reason, the problem described above is more prominent particularly in the solid-state imaging device having the multipixel one-cell configuration.

In view of this, the object of the present invention is to provide a solid-state imaging device which suppresses blooming.

To achieve the above object, a solid-state imaging device according to an aspect of the present invention is a solid-state imaging device which is of a MOS type and includes a plurality of pixels arranged in rows and columns, and the solid-state imaging device includes: a semiconductor substrate; a photoelectric conversion unit which is included in each of the pixels, formed in the semiconductor substrate, and converts, into a signal charge, light that is incident from a first main surface of the semiconductor substrate; a transfer transistor which is included in each of the pixels and formed in a second main surface of the semiconductor substrate, and transfers the signal charge converted by the photoelectric conversion unit, the second main surface being located opposite to the first main surface; a first light shielding film which is conductive and formed on at least part of a boundary between the pixels, above the first main surface of the semiconductor substrate; an overflow drain region formed in the first main surface of the semiconductor substrate and electrically connected to the first light shielding film; and an overflow barrier region formed between the overflow drain region and the photoelectric conversion unit.

With this configuration, the solid-state imaging device according to the aspect of the present invention has a dedicated overflow drain configuration. This allows the solid-state imaging device according to the aspect of the present invention to constantly discharge the excess charge regardless of when the charge is being read from the pixels or when it is being accumulated. Thus, the solid-state imaging device according to the aspect of the present invention can constantly suppress blooming regardless of its operation status.

Furthermore, in the solid-state imaging device according to the aspect of the present invention, an overflow drain configuration is formed on a first main surface side of the semiconductor substrate. This allows forming the dedicated overflow drain configuration without causing area increase.

Furthermore, in the solid-state imaging device according to the aspect of the present invention, a light shielding film is used as a line for supplying voltage to the overflow drain configuration. This allows suppressing area increase in the solid-state imaging device according to the aspect of the present invention.

In addition, the overflow drain region may be formed on the at least part of the boundary between the pixels, and the first light shielding film may cover the overflow drain region.

With this configuration, in the solid-state imaging device according to the aspect of the present invention, the overflow drain configuration is formed under the light shielding film. This allows forming the dedicated overflow drain configuration without causing area increase.

In addition, a plurality of first light shielding films each being the first light shielding film may be formed, and each of the first light shielding films may be linearly formed along the boundary between the pixels, for each boundary in a row direction or in a column direction of the pixels.

With this configuration, it is possible to form a larger opening in the light shielding film, thus allowing increase in sensitivity of the solid-state imaging device according to the aspect of the present invention.

In addition, the first light shielding films may be formed in a grid pattern on boundaries between the pixels.

With this configuration, in the solid-state imaging device according to the aspect of the present invention, it is possible to enhance an advantageous effect of preventing color mixture in an adjacent pixel.

In addition, a plurality of overflow drain regions each being the overflow drain region may be formed, and each of the overflow drain regions may be formed on a grid point at which a boundary line between two pixels adjacent in the row direction intersects with a boundary line between two pixels adjacent in the column direction.

In addition, a plurality of overflow drain regions each being the overflow drain region may be formed, and each of the overflow drain regions may be formed on the boundary between the pixels in the column direction or in the row direction.

In addition, a plurality of overflow drain regions each being the overflow drain region may be formed, and each of the overflow drain regions may be linearly formed to cover the boundary between the pixels in the column direction or in the row direction.

In addition, the overflow drain region may be formed in a grid pattern to cover the boundary between the pixels in the column direction and the row direction.

In addition, a potential barrier of the overflow barrier region may be lower than a potential barrier under a gate electrode of the transfer transistor when the transfer transistor is shut off.

In addition, the solid-state imaging device may further include: a second light shielding film which is conductive and formed on at least part of the boundary between the pixels, above the first main surface of the semiconductor substrate; and a substrate contact region formed in the first main surface of the semiconductor substrate and electrically connected to the second light shielding film.

With this configuration, the solid-state imaging device according to the aspect of the present invention allows fixing the voltage of the semiconductor substrate to, for example, 0 V, thus making it possible to obtain an image with less noise.

In addition, the substrate contact region may be formed on the boundary between the pixels, and the second light shielding film may cover the substrate contact region.

With this configuration, in the solid-state imaging device according to the aspect of the present invention, the substrate contact region is formed under the light shielding film. This allows forming the substrate contact region without causing area increase.

In addition, a plurality of first light shielding films each being the first light shielding film and a plurality of second light shielding films each being the second light shielding film may be formed, each of the first light shielding films and each of the second light shielding films may be linearly formed for each row or column of the pixels, and the first light shielding films and the second light shielding films may be alternately arranged in the row or column direction of the pixels.

In addition, the solid-state imaging device may further include a first drive unit which supplies, to the second light shielding film, a voltage that achieves a potential lower than a potential of the semiconductor substrate when reading, via the transfer transistor, the signal charge accumulated in the photoelectric conversion unit.

With this configuration, the solid-state imaging device according to the aspect of the present invention allows suppressing a phenomenon of afterimage caused by incomplete reading of the charge from within the photoelectric conversion unit.

In addition, the solid-state imaging device may further include a second drive unit which discharges, prior to an exposure period, the charge accumulated in the photoelectric conversion unit, by applying a first voltage to the first light shielding film, and causes the photoelectric conversion unit to accumulate the charge during the exposure period by applying, to the first light shielding film, a second voltage that is lower than the first voltage.

With this configuration, it is possible, through control of the potential in the overflow barrier region, to create a state called an electronic shutter function, which is a state where no signal charge is electrically accumulated in the photoelectric conversion unit. Accordingly, use of the solid-state imaging device according to the aspect of the present invention realizes a camera having an advanced function.

Note that the present invention may be realized as a solid-state imaging device manufacturing method for manufacturing the solid-state imaging device as described above.

Furthermore, the present invention can also be realized as Large Scale Integration (LSI) including such a solid-state imaging device or a camera including such a solid-state imaging device.

As described above, according to the present invention, it is possible to provide a solid-state imaging device which suppresses blooming.

FURTHER INFORMATION ABOUT TECHNICAL BACKGROUND TO THIS APPLICATION

The disclosure of Japanese Patent Application No. 2009-077646 filed on Mar. 26, 2009 including specification, drawings and claims is incorporated herein by reference in its entirety.

The disclosure of PCT application No. JP2010/000352 filed on Jan. 22, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Hereinafter, embodiments of a solid-state imaging device according to the present invention will be described with reference to the drawings.

First Embodiment

As a first embodiment of the present invention, an example configuration of a solid-state imaging device 100 of a back-illuminated MOS type will be described.

In the solid-state imaging device 100 according to the first embodiment of the present invention, a dedicated overflow drain configuration is formed on a back side of a substrate. This allows suppressing blooming while suppressing area increase in the solid-state imaging device 100 according to the first embodiment of the present invention. Furthermore, in the solid-state imaging device 100, a light shielding film is used as a line for supplying voltage to the overflow drain configuration. This allows further suppressing area increase in the solid-state imaging device 100.

First, the configuration of the solid-state imaging device according to the first embodiment of the present invention is described.

Figure 1:
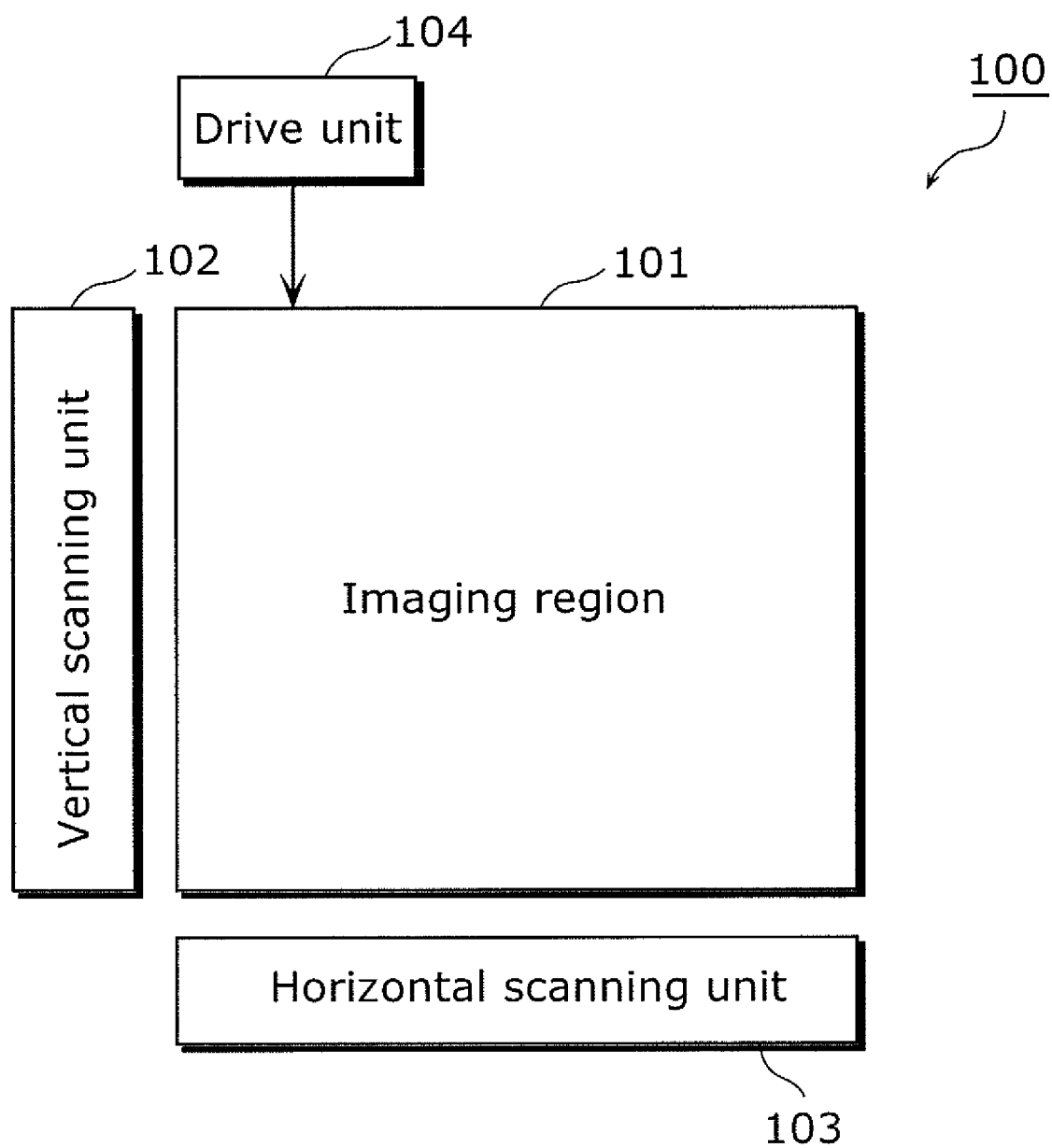
FIG. 1 is a block diagram of a solid-state imaging device according to a first embodiment of the present invention.

FIG. 1 is a block diagram showing an outline configuration of the solid-state imaging device 100 according to the first embodiment of the present invention.

The solid-state imaging device 100 shown in FIG. 1 includes: an imaging region 101, a vertical scanning unit 102, a horizontal scanning unit 103, and a drive unit 104.

The imaging region 101 includes a plurality of pixels which are arranged in a matrix and each of which converts incident light into an electric signal.

The vertical scanning unit 102 sequentially selects rows of pixels in the imaging region 101.

The horizontal scanning unit 103 sequentially selects columns of pixels in the imaging region 101. In addition, the horizontal scanning unit 103 outputs an electric signal converted by the pixel located in the row selected by the vertical scanning unit 102 and the column selected by the horizontal scanning unit 103.

Note that the drive unit 104 will be described later.

Figure 2:
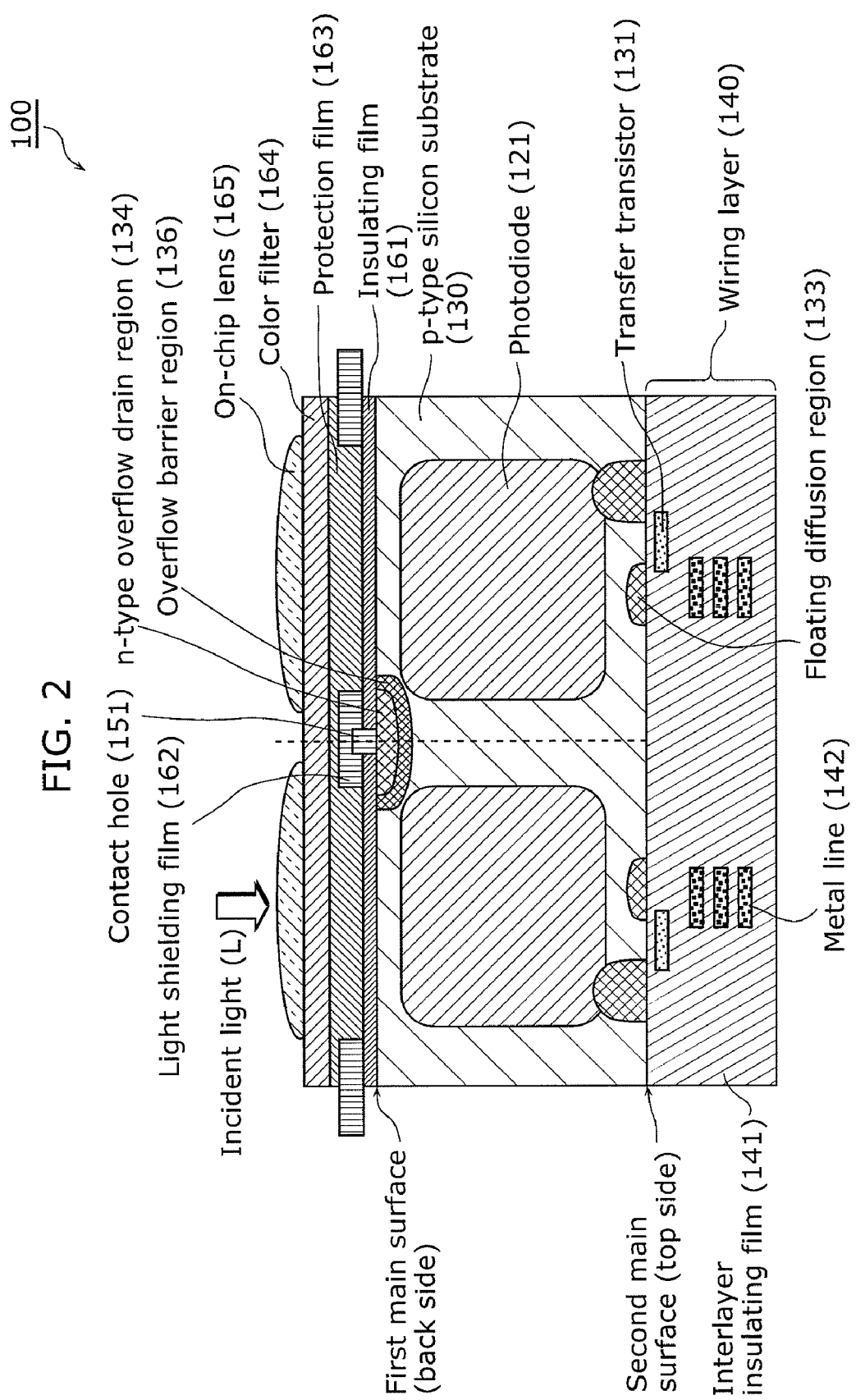
FIG. 2 is a cross-sectional view of the solid-state imaging device according to the first embodiment of the present invention.

FIG. 2 is a block diagram showing an outline configuration of a main part of the solid-state imaging device 100 according to the first embodiment of the present invention. Note that FIG. 2 shows two unit pixels adjacent to each other.

The solid-state imaging device 100 shown in FIG. 2 is a MOS solid-state imaging device. The solid-state imaging device 100 includes: a semiconductor substrate 130 (p-type silicon substrate); a photodiode 121 (photoelectric conversion unit); a wiring layer 140 including an interlayer insulating film 141 and a metal line 142; a transfer transistor 131 which reads an electric charge accumulated in the photodiode 121; a floating diffusion region 133; an overflow drain region 134; an overflow barrier region 136; a contact hole 151, an insulating film 161, a light shielding film 162; a protection film 163; a color filter 164; and an on-chip lens 165.

In addition, each of the pixels included in the solid-state imaging device 100 includes a photodiode 121 and a transfer transistor 131. In addition, each pixel in the solid-state imaging device 100 may additionally include an amplifying transistor, a reset transistor, an address transistor, and so on. The amplifying transistor outputs a voltage according to an amount of charge in the floating diffusion region 133. The reset transistor is a transistor for resetting the charge in the floating diffusion region 133. The address transistor is a transistor for selecting whether or not to drive an amplifying transistor.

The semiconductor substrate 130 is, for example, a p-type silicon epitaxial substrate. Although depending on the specification of each solid-state imaging device, the thickness of the semiconductor substrate 130 is approximately 4 μm to 6 μm in the case of a solid-state imaging device for visible light, and is approximately 6 μm to 10 μm in the case of a solid-state imaging device for near-infrared rays. In addition, an impurity concentration of the semiconductor substrate 130 is, for example, approximately $2 \times 10^{15}$ cm$^{-3}$.

The photodiode 121 is an n-type region formed by ion-injecting As or P into the semiconductor substrate 130. The n-type impurity concentration of the photodiode 121 is, for example, approximately $1 \times 10^{15}$ cm$^{-3}$ to $2 \times 10^{16}$ cm$^{-3}$. In addition, the photodiode 121 performs photoelectric conversion to convert, into a signal charge, incident light L that is incident from the first main surface of the semiconductor substrate 130 and accumulates the signal charge resulting from the photoelectric conversion.

Of the semiconductor substrate 130, in a face (the second main surface) opposite to the face on which the light L is incident (the first main surface), the transfer transistor 131 and the wiring layer 140 are formed.

The transfer transistor 131 includes a gate insulating film and a gate electrode. The gate insulating film and the gate electrode are formed on the second main surface of the semiconductor substrate 130. This gate insulating film is, for example, a silicon oxide film, and the gate electrode is made of, for example, polycrystalline silicon and so on. The transfer transistor 131 transfers the signal charge resulting from the conversion by the photodiode 121, to the floating diffusion region 133.

Note that on the imaging region 101 of the second main surface of the semiconductor substrate 130, the amplifying transistor, the reset transistor, the address transistor, and so on as described above are additionally provided. In addition, in a region other than the imaging region 101 of the second main surface of the semiconductor substrate 130, elements such as transistors which form the vertical scanning unit 102, the horizontal scanning unit 103, and so on are formed.

The wiring layer 140 is formed on the second main surface of the semiconductor substrate 130, and includes the interlayer insulating film 141 and the metal line 142 that is embedded in the interlayer insulating film 141.

Furthermore, on a surface of the semiconductor substrate on a second main surface side, the n-type floating diffusion region 133, the transfer transistor 131, and an n-type drain region and an n-type source region of another transistor are formed.

On the other hand, in the first main surface side of the semiconductor substrate 130, the n-type overflow drain region 134, the overflow barrier region 136, the contact hole 151, the insulating film 161, the light shielding film 162, the protection film 163, the color filter 164, and the on-chip lens 165 are formed.

The insulating film 161 is formed on the first main surface of the semiconductor substrate 130, that is, on an incident-light receiving surface of the semiconductor substrate 130. The insulating film 161 is, for example, silicon oxide film.

The light shielding film 162 is formed on the insulating film 161 and has conductivity. The light shielding film 162 is made of tungsten, aluminum, or copper, for example. The light shielding film 162 has an opening through which light is incident onto the photodiode 121. In other words, the light shielding film 162 is formed only on at least part of a boundary between pixels.

The protection film 163 is formed on the insulating film 161 to cover the light shielding film 162. The protection film 163 is, for example, silicon nitride film.

The color filter 164 is formed on the protection film 163 and passes only light of a predetermined wavelength band.

The on-chip lens 165 is formed on the color filter 164, and collects the incident light L onto the photodiode 121.

Next, the overflow drain configuration that is a feature of the present invention is described. The overflow drain configuration of the present invention is formed in the first main surface side of the semiconductor substrate 130. In addition, the overflow drain configuration is formed on a boundary region between two adjacent pixels.

This overflow drain configuration includes an overflow barrier region 136 and an overflow drain region 134 of n-type.

The overflow drain region 134 is an n-type diffusion region formed in the first main surface side of the semiconductor substrate 130. This overflow drain region 134 is formed under the light shielding film 162. In other words, the light shielding film 162 covers the overflow drain region 134. In addition, the overflow drain region 134 is electrically connected to the light shielding film 162.

The overflow barrier region 136 is a p-type region formed between the overflow drain region 134 and the photodiode 121 of each pixel, and forming a predetermined potential barrier between the overflow drain region 134 and the photodiode 121.

The contact hole 151 electrically connects the overflow drain region 134 and the light shielding film 162.

In addition, the drive unit 104 shown in FIG. 1 applies a desired voltage to the light shielding film 162. The drive unit 104 is, for example, an external power supply for applying a predetermined voltage to the light shielding film 162. Note that the drive unit 104 may be an external input terminal, a line, and so on for supplying, to the light shielding film 162, an input of voltage from outside the solid-state imaging device 100 (for example, supply voltage), or may be a voltage source which generates a predetermined voltage using the supply voltage and so on. Furthermore, the drive unit 104 may have a function to temporally change the voltage to be supplied to the light shielding film 162.

According to the configuration above, the solid-state imaging device 100 allows controlling the potential of the overflow drain region 134 by applying the desired voltage from the drive unit 104 to the light shielding film 162 having conductivity. Specifically, by applying, to the overflow drain region 134, a voltage that is positive with respect to the semiconductor substrate 130, it is possible to control the potential of the overflow barrier region 136 between the photodiode 121 and the overflow drain region 134. This allows discharging, to the external power supply, the excess charge accumulated in the photodiode 121.

Figure 3:
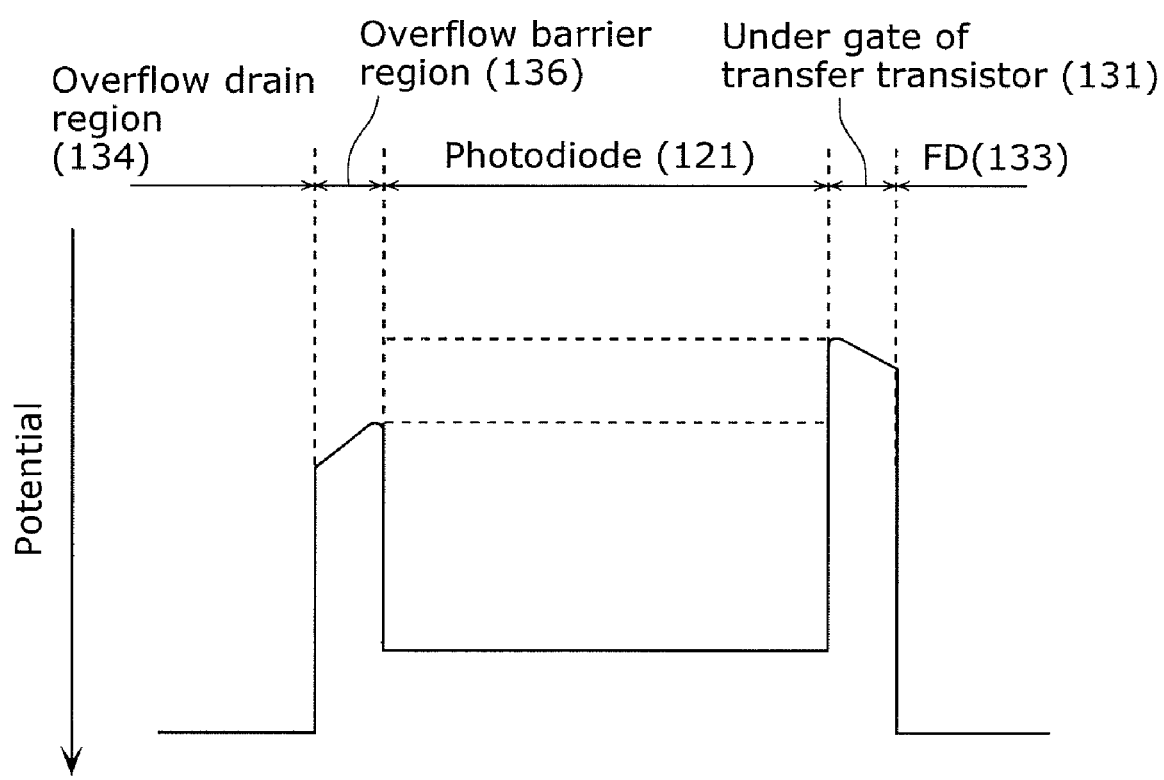
FIG. 3 is a diagram showing a potential distribution in the solid-state imaging device according to the first embodiment of the present invention.

FIG. 3 is a diagram showing a potential distribution in the overflow drain region 134, the overflow barrier region 136, and the photodiode 121, under the gate of the transfer transistor 131, and in the floating diffusion region 133 (FD). Note that FIG. 3 shows the case where the transfer transistor 131 is OFF (not conductive), and the case where a predetermined voltage (for example, supply voltage) is applied to the overflow drain region 134.

As shown in FIG. 3, by setting the potential barrier of the overflow barrier region 136 lower than the potential barrier under the gate of the transfer transistor 131 in an OFF state, it is possible to discharge the excess charge accumulated in the photodiode 121 via the overflow drain region 134.

Note that here the supply voltage has been applied to the overflow drain region 134, but it is only necessary that the voltage is higher than the voltage of the semiconductor substrate 130 (for example, 0 V); thus, a voltage that is equal to or higher than the supply voltage or a voltage that is equal to or lower than the supply voltage may be applied. In other words, it is only necessary that the potential barrier of the overflow barrier region 136 is lower than the potential barrier under the gate of the transfer transistor 131 in an OFF state.

In addition, the case assumed here is where the excess charge accumulated in the photodiode 121 leaks into the floating diffusion region 133 through under the gate of the transfer transistor 131; however, in the case of the excess charge leaking from the photodiode 121 into another path, it is only necessary that the potential barrier of the overflow barrier region 136 is set lower than the potential barrier of the other path. For example, it is possible to assume, as the other path, the source region or drain region of another transistor in the same pixel, or the photodiode 121, the floating diffusion region 133, the source-drain region of the transistor, and so on of an adjacent pixel. Note that the potential is positive downward in FIG. 3 because a negative electron is considered as a carrier. In other words, a higher potential barrier means a lower potential.

Next, an example of a planer configuration of the solid-state imaging device 100 is described with reference to FIGS. 4A, 4B, 5A, 5B, and 5C.

Figure 4A:
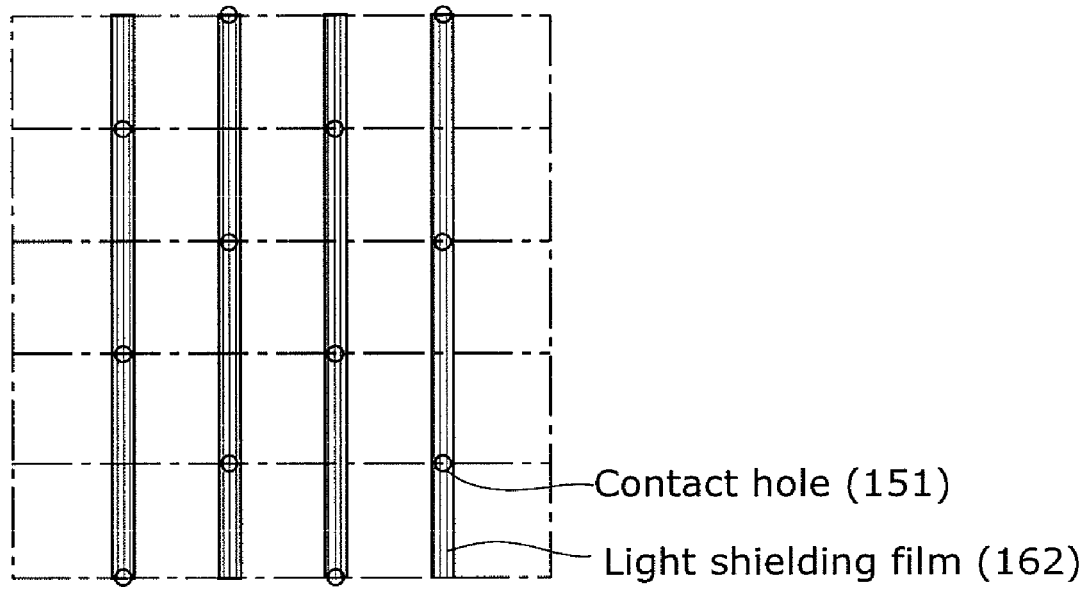
FIG. 4A is a plan view of an example layout of a light shielding film in the solid-state imaging device according to the first embodiment of the present invention.
Figure 4B:
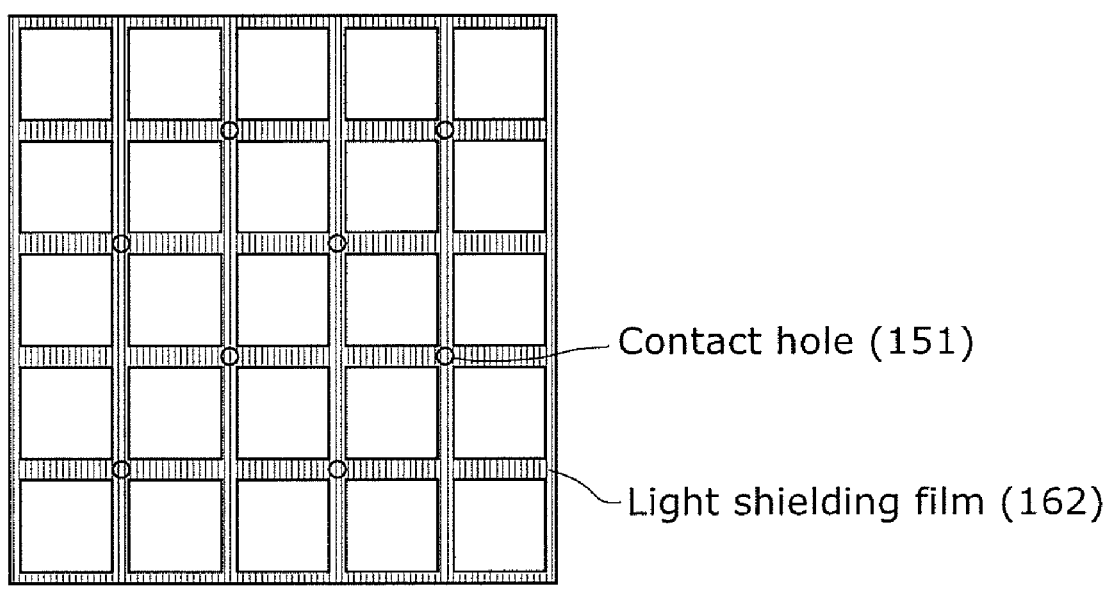
FIG. 4B is a plan view of an example layout of the light shielding film in the solid-state imaging device according to the first embodiment of the present invention.

FIGS. 4A and 4B are plan views each showing an example layout of a part of the imaging region 101, mainly the light shielding film 162.

As shown in FIG. 4A, a plurality of light shielding films 162 are provided for each column. In addition, each light shielding film 162 is linearly formed along a column (vertically in FIG. 4A) on a boundary of pixels that is shown by a dashed line. In addition, the light shielding films 162 are connected outside the imaging region 101, for example, to a supply voltage line. In addition, in a bottom of the light shielding film 162, the contact hole 151 connected to the overflow drain region 134 is formed. Note that each light shielding film 162 may be linearly provided along a row on a boundary between pixels that is shown by a dashed line.

In addition, as shown in FIG. 4B, the light shielding film 162 may be provided in a grid pattern on boundaries between pixels as shown by dashed lines. In addition, the light shielding film 162 formed in the grid pattern is connected outside the imaging region 101, for example, to a supply voltage line.

Note that such forming of the light shielding film 162 in a grid pattern as shown in FIG. 4B enhances light shielding performance. This allows increasing the effect of preventing color mixture in adjacent pixels.

On the other hand, forming the light shielding films 162 in a linear form as shown in FIG. 4A allows providing a larger opening in the light shielding films 162, thus allowing increase in the sensitivity of the solid-state imaging device 100. Note that in the case of providing three types of pixels, for example, R, G, and B in the imaging region 101, color mixture is less likely to be caused between adjacent pixels in one of the row and column directions. Thus, in the case of providing more than one type of pixels, forming the light shielding films in a linear form as shown in FIG. 4A allows increasing the sensitivity of the solid-state imaging device 100 without increasing occurrence of color mixture.

Figure 5C:
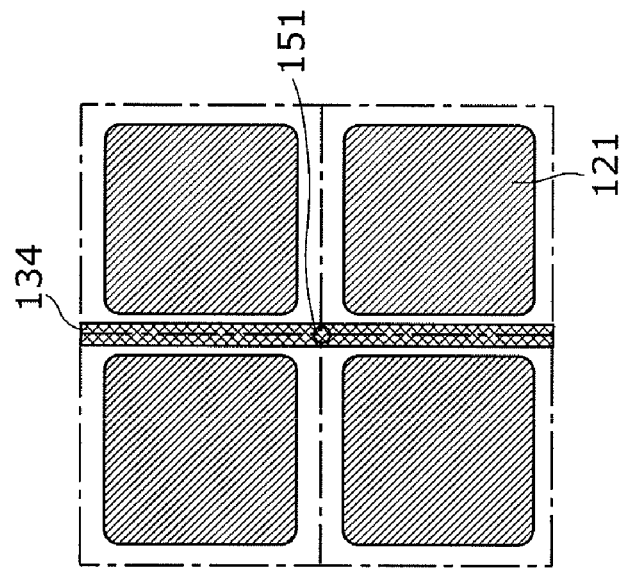
FIG. 5C is a plan view of an example layout of the overflow drain region in the solid-state imaging device according to the first embodiment of the present invention.
Figure 5B:
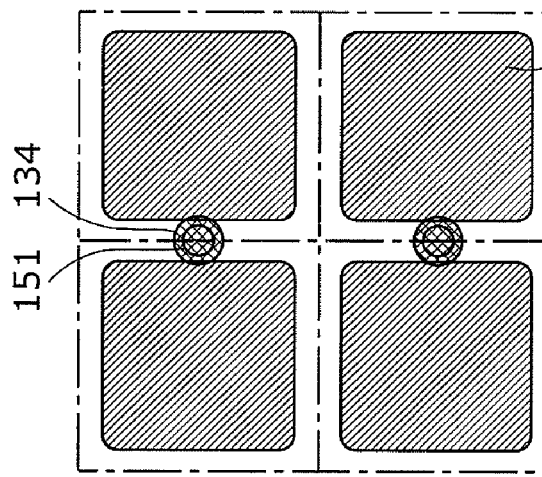
FIG. 5B is a plan view of an example layout of the overflow drain region in the solid-state imaging device according to the first embodiment of the present invention.
Figure 5A:
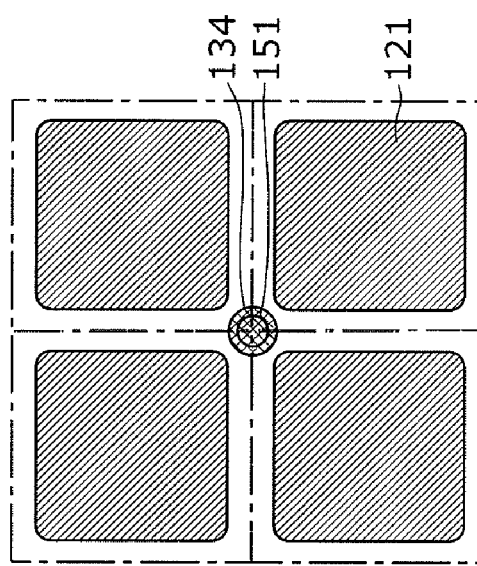
FIG. 5A is a plan view of an example layout of an overflow drain region in the solid-state imaging device according to the first embodiment of the present invention.

FIGS. 5A to 5C are plan views each showing an example of layout and shape of the overflow drain region 134.

For example, as shown in FIG. 5A, the overflow drain region 134 is formed on a grid point at which a boundary line between two pixels adjacent in the row direction intersects with a boundary line between two pixels adjacent in the column direction. In other words, the overflow drain region 134 is formed on a boundary between the four pixels. Note that the overflow drain region 134 may be formed at only one of four corners of one pixel, or may be formed at two corners located diagonally to each other, or may be formed at all the corners.

In addition, as shown in FIG. 5B, the overflow drain region 134 may be formed on a boundary between adjacent two pixels that extends in the column direction. Note that the overflow drain region 134 may be formed on a boundary between adjacent two pixels that extends in the row direction. In addition, the overflow drain region 134 may be formed, of the four sides of one pixel, on two sides in a vertical direction or on two sides in a horizontal direction, or may be formed on all the four sides.

In addition, as shown in FIG. 5C, the overflow drain region 134 may be linearly formed on a boundary between pixels as shown by a dashed line. In other words, the overflow drain region 134 may be formed in a linear form to cover the boundary between pixels in the column direction or row direction.

In addition, although not shown, the overflow drain region 134 may be formed in the grid pattern to cover the boundary in the row and column direction of the pixels. In addition, the layout of the overflow drain region 134 may be other than the layout above.

Note that increasing the area of the overflow drain region 134 increases the effect of discharging, to the power supply and so on, the excess charge generated in the photodiode 121.

In addition, a planer shape of the light shielding film 162 and the overflow drain region 134 can be selected from among combinations of the respective configurations described above.

As described above, the solid-state imaging device 100 according to the first embodiment of the present invention has a dedicated overflow drain configuration. This allows the solid-state imaging device 100 to constantly discharge the excess charge regardless of when the charge is being read from pixels or when it is being accumulated. Thus, the solid-state imaging device 100 according to the present invention can constantly suppress blooming regardless of its operation status.

In addition, the solid-state imaging device 100, due to having a dedicated overflow drain configuration, allows producing a sufficient effect of discharging the excess charge even in the case of incidence of high-intensity light. Furthermore, it is possible to easily apply the configuration according to the present invention to a pixel configuration in which one floating diffusion region is shared between a plurality of photodiodes.

In addition, in the solid-state imaging device 100, an overflow drain configuration is formed in the first main surface side (back side) of the semiconductor substrate. This allows forming the dedicated overflow drain configuration without causing area increase.

In addition, since the solid-state imaging device 100 includes the light shielding films 162 formed in a boundary portion between pixels, it is possible to suppress generation of photoelectrons which is caused when the light obliquely incident on the first main surface of the semiconductor substrate 130 reaches, without being absorbed in the semiconductor substrate 130, an adjacent pixel to be absorbed therein. Accordingly, the solid-state imaging device 100 can suppress what is called color mixture due to the generation of photoelectrons.

In addition, in the solid-state imaging device 100, the overflow drain configuration is formed under the light shielding film 162. This allows forming the dedicated overflow drain configuration without causing area increase.

Furthermore, in the solid-state imaging device 100, the light shielding film 162 is used as a line for supplying voltage to the overflow drain configuration. This allows suppressing area increase in the solid-state imaging device 100.

Furthermore, by temporally controlling the voltage of the overflow drain region 134, it is also possible to realize what is called the electronic shutter function. Specifically, the drive unit 104 may discharge, before the start of an exposure period, all the charge in the photodiode 121 by applying a high voltage to the overflow drain region 134, or may accumulate the photocharge in the photodiode 121 for a period corresponding to the exposure time by decreasing the voltage of the overflow drain region 134. Thus, it is possible to perform electrical control of the shutter time.

Here, in the case of forming the overflow drain region 134 in the second main surface (top side) of the semiconductor substrate 130, it is necessary to provide, on the second main surface (top side) of the semiconductor substrate 130, a line for driving the overflow drain region 134. In this case, since the second main surface (top side) includes a line for transmitting a minute signal resulting from photoelectric conversion, there is a problem that degradation is more likely to be caused in a captured image due to the influence of inductive noise from a line for driving the overflow drain region 134. On the other hand, in the solid-state imaging device 100 according to the first embodiment of the present invention, the light shielding films 162 provided in the first main surface (back side) of the semiconductor substrate 130 are used as the lines for driving the overflow drain region 134. Thus, in the solid-state imaging device 100 according to the first embodiment of the present invention, the lines on the second main surface are not affected by noise.

Note that the electronic shutter may be embodied as what is called the global shutter which simultaneously discharges the charges in all the pixels or as what is called the rolling shutter which sequentially discharges the charges by each row. Note that to realize the rolling shutter, it is necessary to form the light shielding film 162 independently for each row. In addition, the drive unit 104 generates a pulse signal that is to be sequentially applied, with different timing, to each of the light shielding film 162 formed for each row.

In addition, the high voltage, which is to be applied to the overflow drain region 134 by the drive unit 104 so as to discharge all the charge in the photodiode 121, needs to be higher than a voltage during the operation of discharging the excess charge as described above. For example, the supply voltage may be applied for discharging the excess charge, and a voltage higher than the supply voltage may be applied for discharging all the charge in the photodiode 121. Alternatively, the supply voltage may be applied for discharging all the charge in the photodiode 121, and a voltage lower than the supply voltage may be applied for discharging the excess charge.

In addition, in the solid-state imaging device 100 according to the first embodiment of the present invention, the drive unit 104 can apply an arbitrary voltage to the overflow drain region 134. This produces an advantage of providing more freedom in structural design such as the impurity concentration of the overflow barrier region 136.

Specifically, the impurity concentration of the overflow barrier region 136 may be determined according to the distance between the overflow drain region 134 and the photodiode 121 and by applying a practical voltage (for example, supply voltage) such that the potential barrier of the overflow barrier region 136 is lower than the potential barrier under the gate of the transfer transistor 131. For example, when the impurity concentration of the semiconductor substrate 130 is $2 \times 10^{15}$ cm$^{-3}$, it is possible to produce a blooming suppressing effect by applying an overflow drain voltage of approximately 2 to 8 V, without particularly introducing the impurity into the overflow barrier region 136. However, in the case of the photodiode 121 overlapping with the overflow drain region 134, the impurity concentration of the overflow barrier region 136 may be adjusted for an appropriate overflow drain voltage, by ion-injecting a p-type impurity such as B into a region that is to be the overflow barrier region 136.

Next, the method of manufacturing the solid-state imaging device 100 described above is described.

FIGS. 6A to 6D are process cross-sectional diagrams each showing a configuration in each manufacturing process of the solid-state imaging device 100.

Figure 6A:
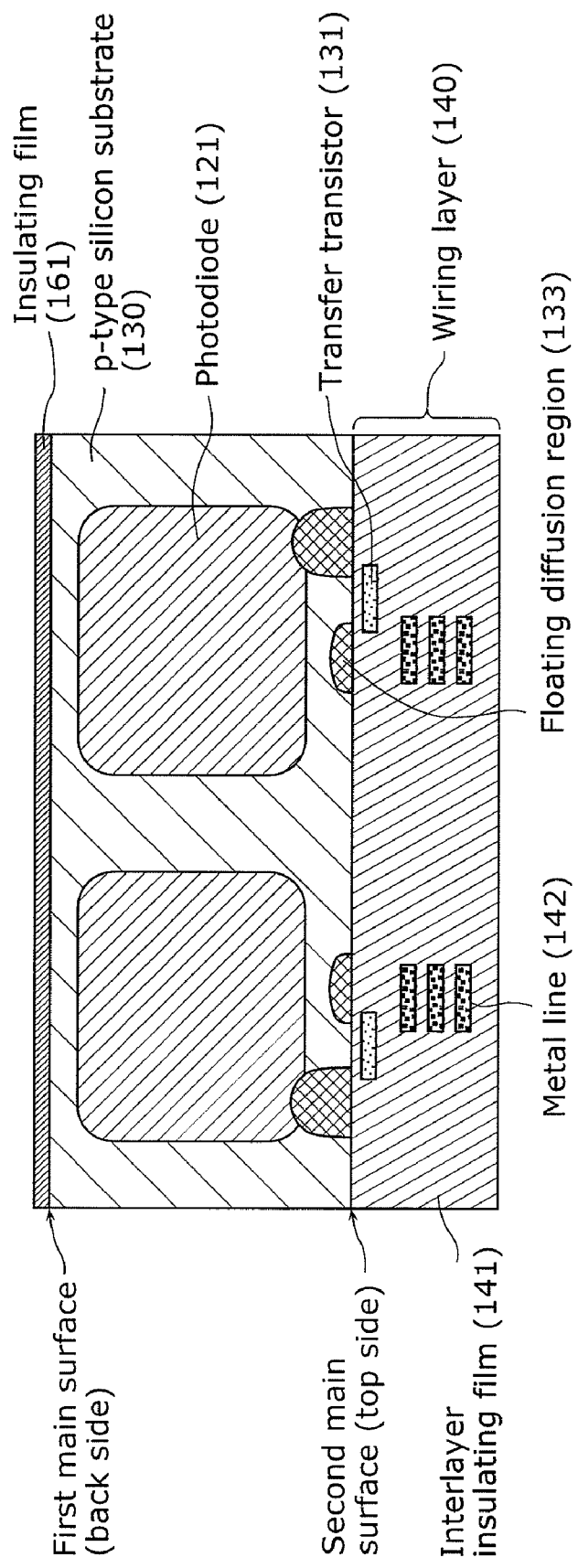
FIG. 6A is a cross-sectional view of the solid-state imaging device according to the first embodiment of the present invention, in a manufacturing process.

As shown in FIG. 6A, the photodiode 121 is formed in the semiconductor substrate 130, and subsequently, transistors such as the transfer transistor 131 and so on and the wiring layer 140 are sequentially formed on the second main surface of the semiconductor substrate 130. Next, an insulating film 161 is formed on the first main surface of the semiconductor substrate 130.

Figure 6B:
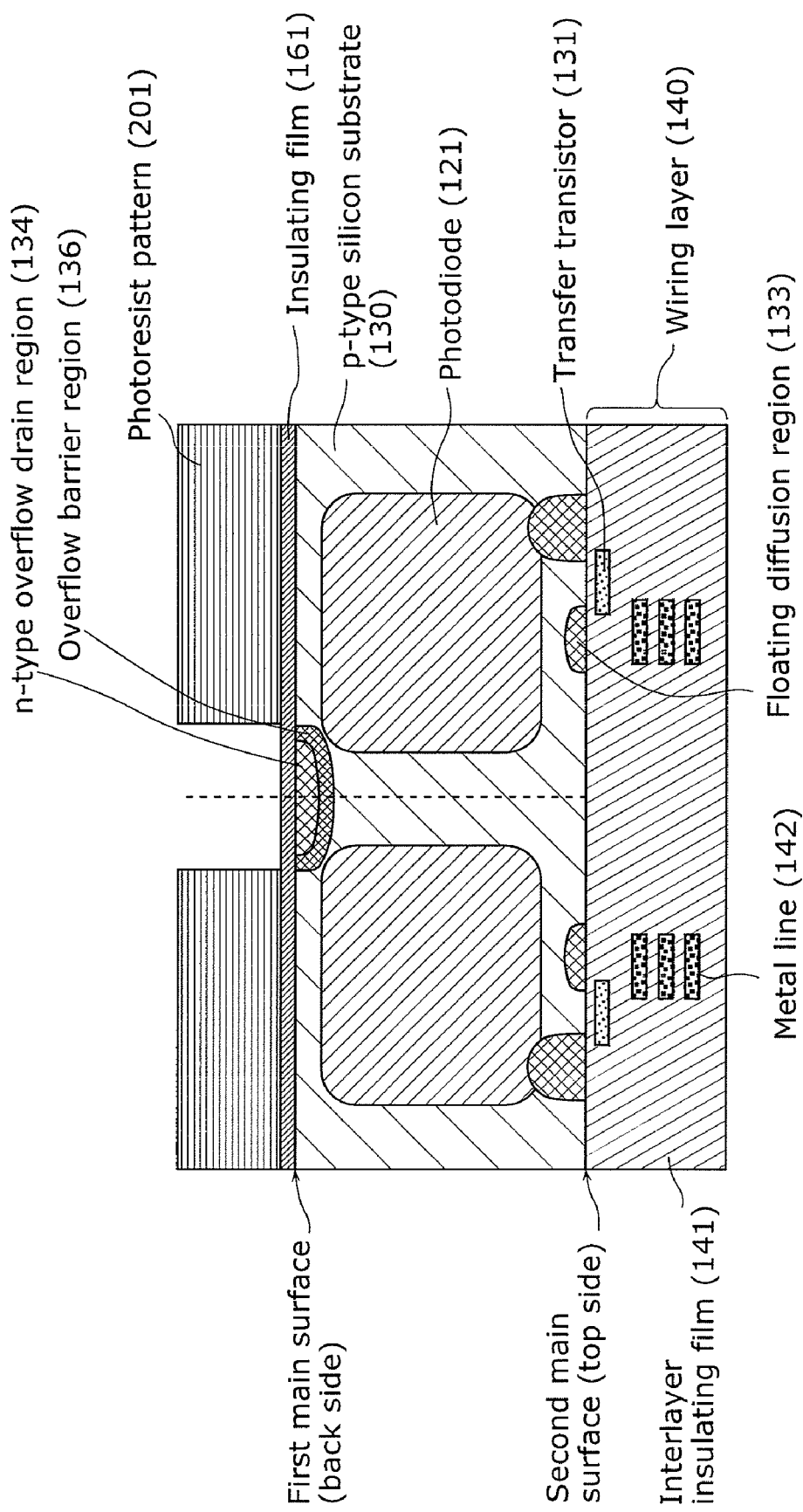
FIG. 6B is a cross-sectional view of the solid-state imaging device according to the first embodiment of the present invention, in the manufacturing process.

Next, as shown in FIG. 6B, a photoresist pattern 201 is formed on the insulating film 161. Next, the overflow drain region 134 is formed by ion-injecting As, for example, at approximately $1 \times 10^{15}$ cm$^{-2}$ to $2 \times 10^{15}$ cm$^{-2}$ into an opening of the photoresist pattern 201.

Here, in the present embodiment, the overflow barrier region 136 is formed without any particular processing. However, the overflow drain barrier region 136 may be formed in consideration of the impurity concentration of the semiconductor substrate 130, the shape of the photodiode 121, and so on such that an appropriate level of voltage is applied to the overflow drain region 134. For example, when the level of the impurity concentration is high between the overflow drain region 134 and the photodiode 121, there is a method of ion-injecting As or P that is an n-type impurity, from the pattern opening of the photoresist pattern 201 up to a point deeper than the As forming the overflow drain region 134. In addition, when ion-injecting As to form the overflow drain region 134, a method of adjusting energy to be injected may be used to reduce the distance between the overflow drain region 134 and the photodiode 121. After completion of this ion injection, heat treatment around 400° C. is performed so as to activate the ion-injected impurity. For this heat treatment, it is possible to use short-time laser annealing and so on.

Figure 6C:
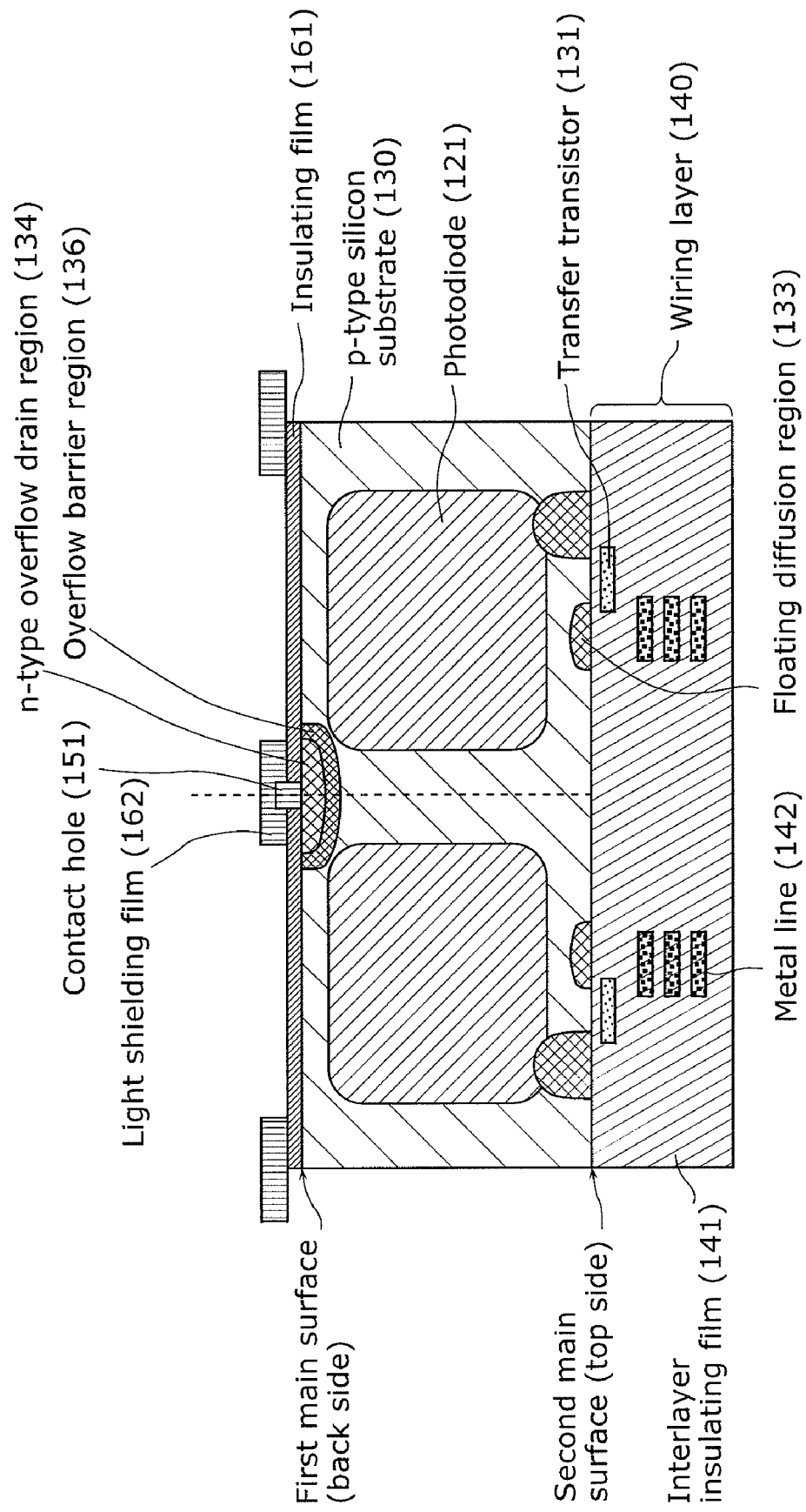
FIG. 6C is a cross-sectional view of the solid-state imaging device according to the first embodiment of the present invention, in the manufacturing process.

Next, as shown in FIG. 6C, after forming an opening in the insulating film 161 of the overflow drain region 134, a laminated metal film may be formed by sequentially laminating a TiN film and an aluminum film by the sputtering method. Subsequently, the light shielding film 162 described above is formed by selectively etching the laminated metal layer using a general photolithography method.

Figure 6D:
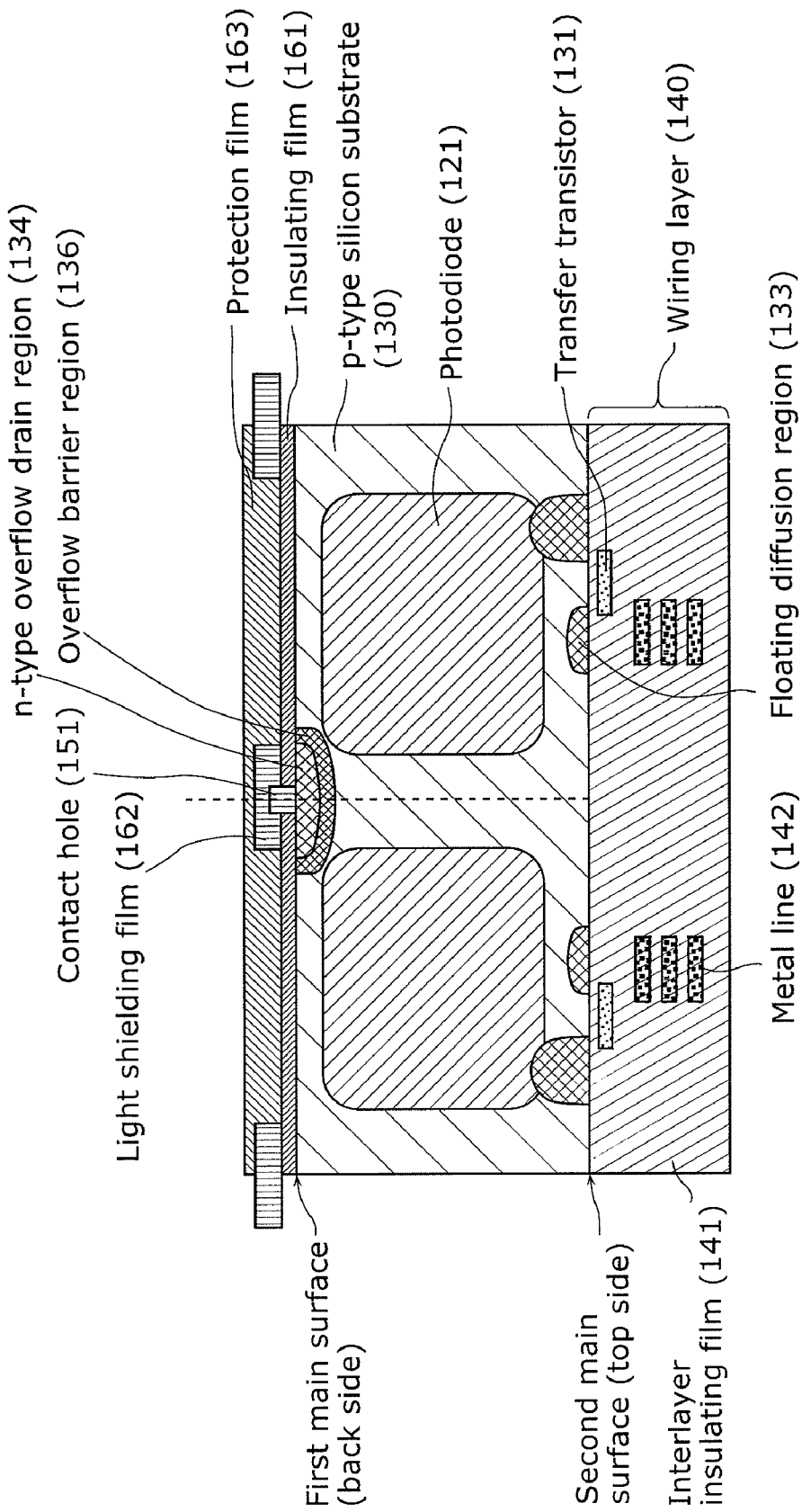
FIG. 6D is a cross-sectional view of the solid-state imaging device according to the first embodiment of the present invention, in the manufacturing process.

Next, as shown in FIG. 6D, a protection film 163 is formed on the first main surface of the semiconductor substrate 130 by, for example, depositing a silicon nitride film by the plasma CVD method. With heat treatment around 400 C.° performed after the depositing, hydrogen contained in the protection film 163 restores the light shielding film 162 and the insulating film 161 that are damaged by dry etching. This allows reducing dark current, and an image defect called a white defect.

Next, the color filter 164 and the on-chip lens 165 are formed on the protection film 163.

According to the processing above, the configuration of the solid-state imaging device 100 shown in FIG. 2 is formed.

Second Embodiment

A solid-state imaging device 200 according to a second embodiment of the present invention is a variation of the solid-state imaging device 100 according to the first embodiment described above, and further includes a substrate contact region 138 in addition to the configuration of the solid-state imaging device 100.

Figure 7:
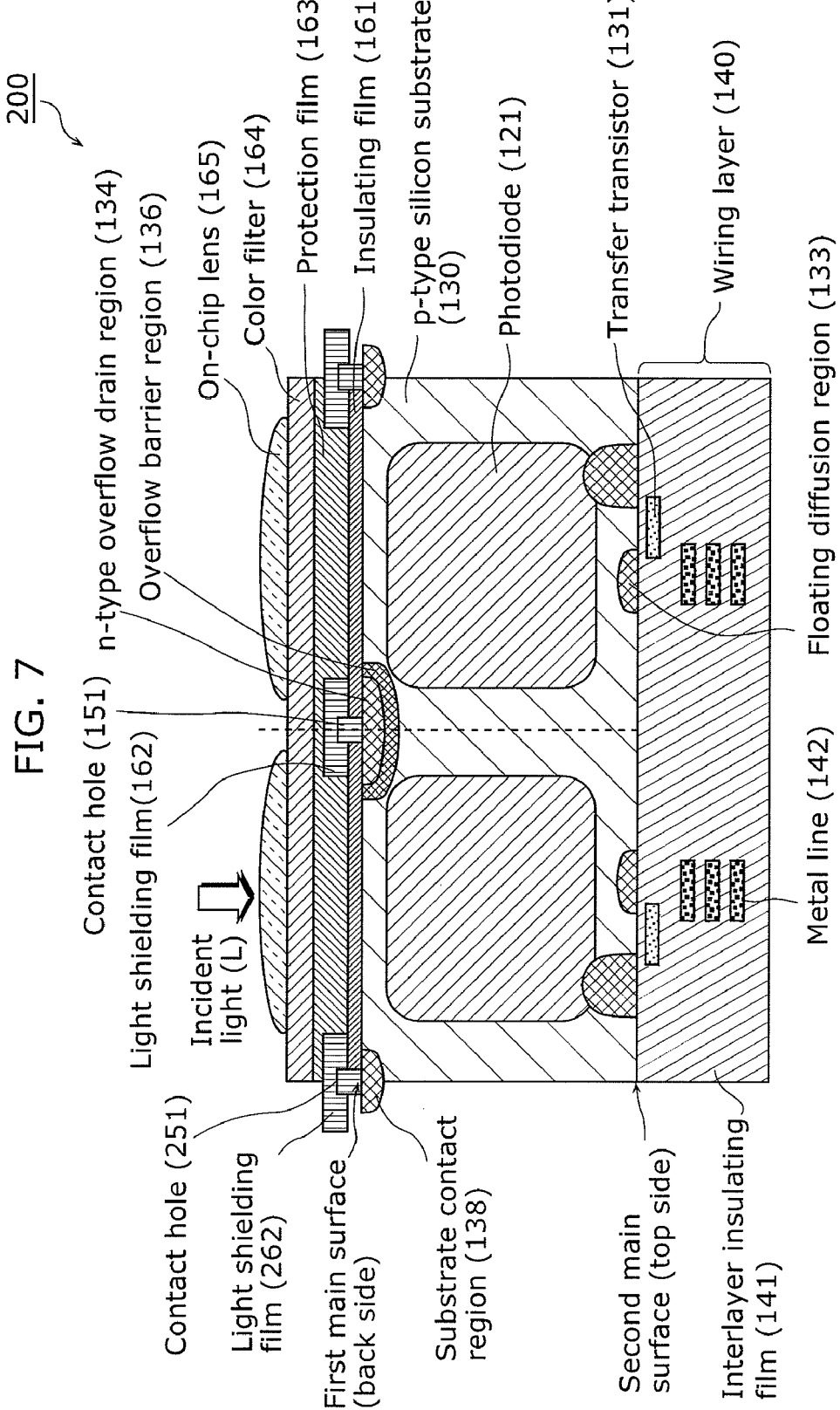
FIG. 7 is a cross-sectional view of the solid-state imaging device according to a second embodiment of the present invention.
Figure 8:
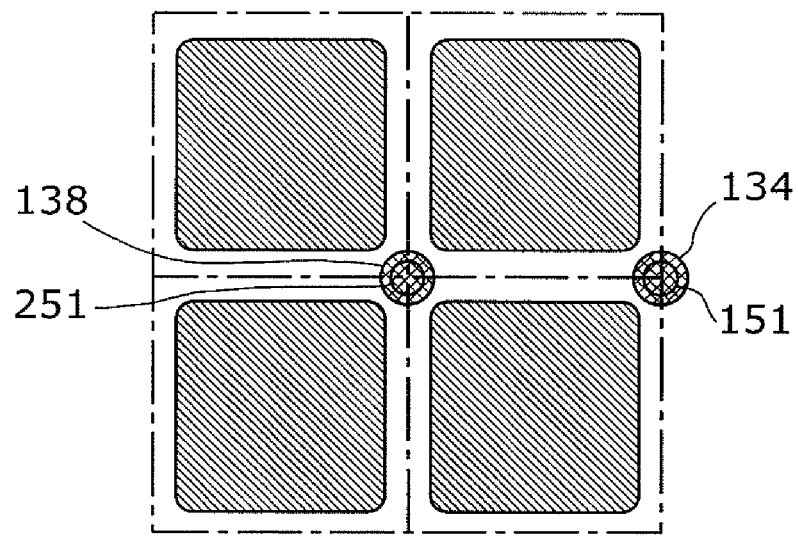
FIG. 8 is a plan view of an example layout of the overflow drain region in the solid-state imaging device according to the second embodiment of the present invention.
Figure 9:
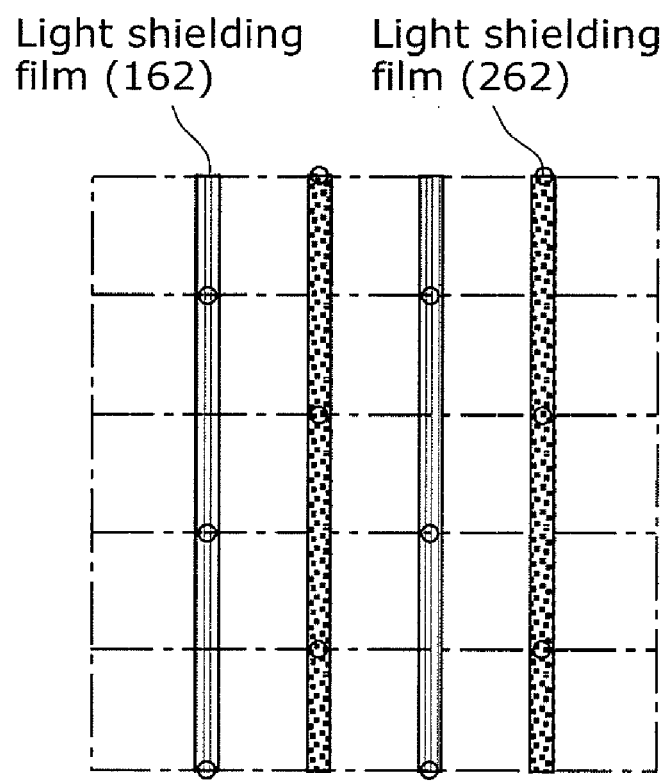
FIG. 9 is a plan view of an example layout of the light shielding film in the solid-state imaging device according to the second embodiment of the present invention.
Figure 10A:
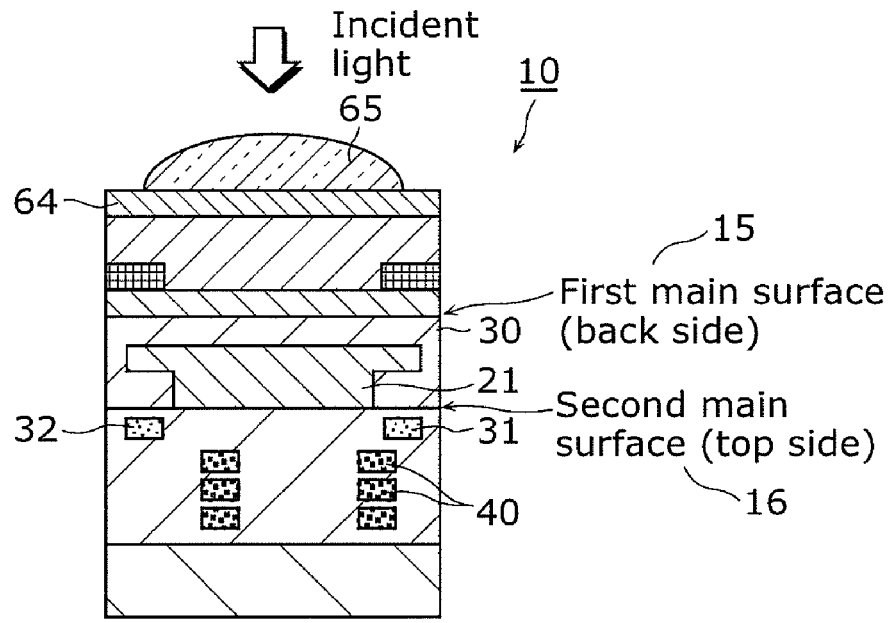
FIG. 10A is a cross-sectional view of a conventional solid-state imaging device.
Figure 10B:
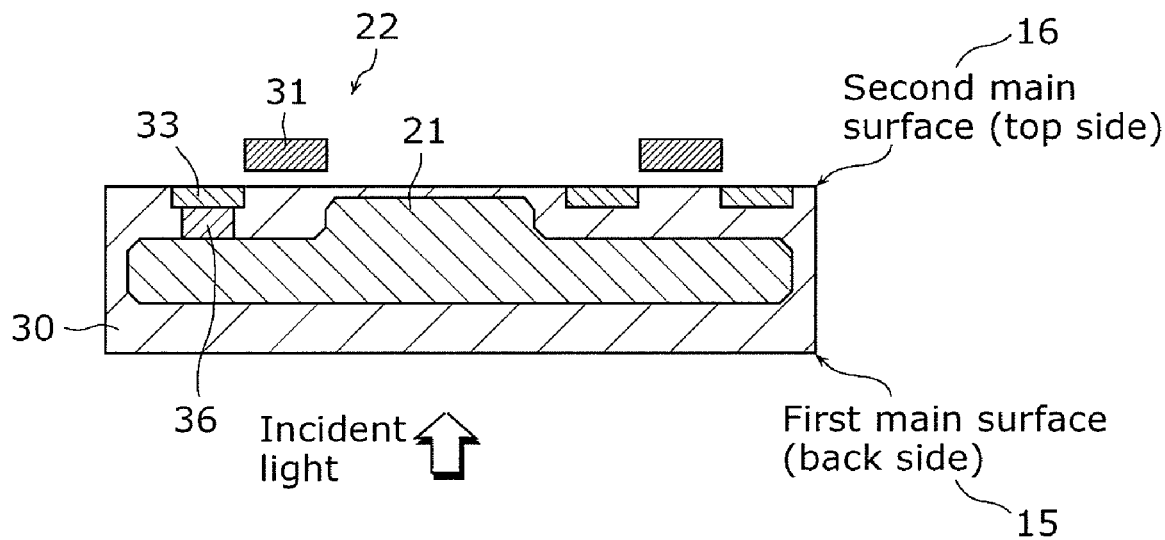
FIG. 10B is a cross-sectional view of the conventional solid-state imaging device.

FIG. 7 is a cross-sectional diagram of a main part of a pixel of the solid-state imaging device 200 according to the second embodiment of the present invention. FIG. 8 is a plan view showing an example of a position and a shape of each of the overflow drain region 134 and the substrate contact region 138. FIG. 9 is a plan view showing a part of the imaging region 101, mainly an example layout of light shielding films 162 and 262. Note that the same elements as in the solid-state imaging device 100 according to the first embodiment are assigned with the same numerical references, and the overlapping descriptions will be omitted.

As shown in FIGS. 7 to 9, the solid-state imaging device 200 further includes, in addition to the configuration of the solid-state imaging device 100, the substrate contact region 138, the light shielding film 262, and a contact hole 251.

The substrate contact region 138 is formed in the first main surface of the semiconductor substrate 130. The substrate contact region 138 is a p-type diffusion region formed by ion-injecting a p-type impurity such as B.

The light shielding film 262, as with the light shielding film 162, is formed on the insulating film 161 and has conductivity. For example, the light shielding film 262 is made of tungsten, aluminum, or copper. The light shielding film 262 has an opening formed to allow the light to be incident onto the photodiode 121. In other words, the light shielding film 262 is formed only on a boundary between pixels. In addition, the light shielding film 262 is formed to cover the substrate contact region 138.

In addition, a voltage that achieves the same potential as that of the semiconductor substrate 130 is applied to the light shielding film 262. For example, the drive unit 104 shown in FIG. 1 applies 0 V to (grounds) the light shielding film 262.

The contact hole 251 electrically connects the overflow contact region 138 and the light shielding film 262.

Generally, in the imaging region 101, due to a small width (depth) of a p-type region around the photodiode 121, it is not possible to fix the potential of the p-type region in the entire imaging region 101. In contrast, forming the substrate contact region 138 allows fixing the potential of the p-type region in the entire imaging region 101 to, for example, 0 V.

In addition, as shown in FIG. 8, for example, the substrate contact regions 138 and the overflow drain regions 134 are formed on grid points at which boundary lines between two pixels adjacent in the row direction intersect with boundary lines between two pixels adjacent in the column direction. In addition, the substrate contact regions 138 and the overflow drain regions 134 are alternately formed on the grid points.

Note that the substrate contact regions 138 and the overflow drain regions 134 may be provided in a grid pattern or may be provided in a striped pattern.

In addition, the substrate contact regions 138 and the overflow drain regions 134 may be formed on boundaries between two adjacent pixels which extend in the column direction. In addition, the substrate contact regions 138 and the overflow drain regions 134 may be linearly and alternately formed in the column or row direction, on pixel boundaries indicated by dashed lines.

In addition, as shown in FIG. 9, the light shielding films 162 and 262 are linearly arranged to extend in the column direction. In addition, the light shielding films 162 and 262 are alternately arranged in the row direction. Note that the light shielding films 162 and 262 may be linearly arranged to extend in the row direction.

As described above, in the solid-state imaging device 200 according to the second embodiment of the present invention, the forming of the substrate contact region 138 allows fixing, for example, to 0 V, the potential of the p-type region (semiconductor substrate 130) of the entire imaging region 101, in addition to the advantageous effect produced by the solid-state imaging device 100 according to the first embodiment as described above. This allows the solid-state imaging device 200 to obtain an image with less noise.

In addition, in the solid-state imaging device 200, the substrate contact region 138 is formed in the first main surface of the semiconductor substrate 130. This allows forming the substrate contact region 138 without causing area increase.

In addition, in the solid-state imaging device 200, the substrate contact region 138 is formed under the light shielding film 262. Furthermore, the solid-state imaging device 200 includes the light shielding film 262 as a line for supplying voltage to the substrate contact region 138. This allows further suppressing area increase in the solid-state imaging device 200.

In addition, for example, when reading the charge accumulated in the photodiode 121, it is possible to drive, by applying a negative voltage to the substrate contact region 138, the charge (electrons) near the first main surface of the semiconductor substrate 130 in the photodiode 121, to the side of the transfer transistor 131 that is formed near the second main surface of the semiconductor substrate 130. In other words, the drive unit 104, when reading the charge accumulated in the photodiode 121, may supply a negative voltage to the substrate contact region 138 via the light shielding film 262. In other words, the drive unit 104, when reading the charge, supplies the negative voltage to the light shielding film 262 and supplies, to the light shielding film 262, the voltage that achieves the same potential as that of the semiconductor substrate 130 (for example, 0 V) during an operation other than the reading. Here, the negative voltage is a voltage lower than the voltage of the semiconductor substrate 130.

This allows suppressing a phenomenon of afterimage caused by incomplete reading of the charge from the photodiode 121.

Note that each of the solid-state imaging devices 100 and 200 according to the first or the second embodiment is realized as an LSI that is a semiconductor integrated circuit. Note that all the configurations shown in FIG. 1 may be formed into one chip or may be formed with a plurality of chips. For example, only the drive unit 104 may be formed into another chip.

The LSI here is also called: the IC, the system LSI, the super LSI, and the ultra LSI, depending on the degree of integration.

In addition, the present invention may be realized as a digital video camera including the solid-state imaging device 100 or 200, or a camera such as a digital still camera.

In addition, all the conductivity types (n-type and p-type) of the semiconductor layer and the diffusion region described above may be reversed.

In addition, each figure above is a diagram schematically showing the configuration of the solid-state imaging device 100 or 200 according to an implementation of the present invention, and any configuration with each constituent element modified for manufacturing reasons and so on is also included in the present invention. For example, a side of each constituent element that is vertically or horizontally drawn may be tilted at a predetermined angle from its vertical and the horizontal position. In addition, a corner and a side of each constituent element are linearly drawn, but at least part of the angle and the side may be rounded.

In addition, at least part of the configurations and functions of the solid-state imaging devices 100 and 200 according to the first and second embodiments described above and a variation thereof may be combined.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a solid-state imaging device, and is particularly applicable to a MOS solid-state imaging device used for a digital video camera, a digital still camera, and so on.

What is claimed is:

1. A solid-state imaging device which is of a MOS type and includes a plurality of pixels arranged in rows and columns, said solid-state imaging device comprising:
   a semiconductor substrate;
   a photoelectric conversion unit included in each of the pixels, formed in said semiconductor substrate, and configured to convert, into a signal charge, light that is incident from a first main surface of said semiconductor substrate;
   a transfer transistor which is included in each of the pixels and formed in a second main surface of said semiconductor substrate, and transfers the signal charge converted by said photoelectric conversion unit, the second main surface being located opposite to the first main surface;
   a first light shielding film which is conductive and formed on at least part of a boundary between the pixels, above the first main surface of said semiconductor substrate;
   an overflow drain region formed in the first main surface of said semiconductor substrate and electrically connected to said first light shielding film; and
   an overflow barrier region formed between said overflow drain region and said photoelectric conversion unit.

2. The solid-state imaging device according to claim 1, wherein said overflow drain region is formed on the at least part of the boundary between the pixels, and
said first light shielding film covers said overflow drain region.

3. The solid-state imaging device according to claim 1, wherein a plurality of first light shielding films each being said first light shielding film are formed, and
each of said first light shielding films is linearly formed along the boundary between the pixels, for each boundary in a row direction or in a column direction of the pixels.

4. The solid-state imaging device according to claim 1, wherein said first light shielding films are formed in a grid pattern on boundaries between the pixels.

5. The solid-state imaging device according to claim 1, wherein a plurality of overflow drain regions each being said overflow drain region are formed, and
each of said overflow drain regions is formed on a grid point at which a boundary line between two pixels adjacent in the row direction intersects with a boundary line between two pixels adjacent in the column direction.

6. The solid-state imaging device according to claim 1, wherein a plurality of overflow drain regions each being said overflow drain region are formed, and
each of said overflow drain regions is formed on the boundary between the pixels in the column direction or in the row direction.

7. The solid-state imaging device according to claim 1, wherein a plurality of overflow drain regions each being said overflow drain region are formed, and
each of said overflow drain regions is linearly formed to cover the boundary between the pixels in the column direction or in the row direction.

8. The solid-state imaging device according to claim 1, wherein said overflow drain region is formed in a grid pattern to cover the boundary between the pixels in the column direction and the row direction.

9. The solid-state imaging device according to claim 1, wherein a potential barrier of said overflow barrier region is lower than a potential barrier under a gate electrode of said transfer transistor when said transfer transistor is shut off.

10. The solid-state imaging device according to claim 1, further comprising:
    a second light shielding film which is conductive and formed on at least part of the boundary between the pixels, above the first main surface of said semiconductor substrate; and
    a substrate contact region formed in the first main surface of said semiconductor substrate and electrically connected to said second light shielding film.

11. The solid-state imaging device according to claim 10, wherein said substrate contact region is formed on the boundary between the pixels, and
said second light shielding film covers said substrate contact region.

12. The solid-state imaging device according to claim 10, wherein a plurality of first light shielding films each being said first light shielding film and a plurality of second light shielding films each being said second light shielding film are formed,
each of said first light shielding films and each of said second light shielding films are linearly formed for each row or column of the pixels, and
said first light shielding films and said second light shielding films are alternately arranged in the row or column direction of the pixels.

13. The solid-state imaging device according to claim 10, further comprising
a first drive unit configured to supply, to said second light shielding film, a voltage that achieves a potential lower than a potential of said semiconductor substrate when reading, via said transfer transistor, the signal charge accumulated in said photoelectric conversion unit.

14. The solid-state imaging device according to claim 1, further comprising
 a second drive unit configured to discharge, prior to an exposure period, the charge accumulated in said photoelectric conversion unit, by applying a first voltage to said first light shielding film, and to cause said photoelectric conversion unit to accumulate the charge during the exposure period by applying, to said first light shielding film, a second voltage that is lower than the first voltage.

* * * * *